(12) United States Patent
Kim et al.

(10) Patent No.: US 9,082,540 B2
(45) Date of Patent: Jul. 14, 2015

(54) COMMON MODE FILTER AND METHOD OF MANUFACTURING THE SAME

(75) Inventors: Yong Suk Kim, Gyeonggi-do (KR); Sung Kwon Wi, Seoul (KR); Jeong Bok Kwak, Gyeonggi-do (KR); Sang Moon Lee, Seoul (KR); Won Chul Sim, Gyeonggi-do (KR); Young Seuck Yoo, Seoul (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 360 days.

(21) Appl. No.: 13/429,068

(22) Filed: Mar. 23, 2012

(65) Prior Publication Data

US 2013/0169381 A1    Jul. 4, 2013

(30) Foreign Application Priority Data

Dec. 30, 2011    (KR) .................. 10-2011-0146880

(51) Int. Cl.
*H03H 7/01* (2006.01)
*B32B 38/04* (2006.01)
*B32B 37/24* (2006.01)
(Continued)

(52) U.S. Cl.
CPC ........... *H01F 17/0033* (2013.01); *H03H 7/427* (2013.01); *B32B 38/04* (2013.01); *H01F 17/0013* (2013.01); *H01F 2017/0093* (2013.01); *H03H 2001/0057* (2013.01); *H03H 2001/0085* (2013.01); *Y10T 156/1057* (2013.01)

(58) Field of Classification Search
CPC .......... H03H 7/427; H03H 2001/0057; H03H 2001/0085; H01F 17/0033; H01F 17/0013; H01F 2017/0093

USPC .......................................................... 333/185
See application file for complete search history.

(56) References Cited

U.S. PATENT DOCUMENTS

| 6,438,000 | B1 * | 8/2002 | Okamoto et al. | 363/40 |
| 2002/0014942 | A1 * | 2/2002 | Harding | 336/212 |

(Continued)

FOREIGN PATENT DOCUMENTS

| JP | 03-220707 B2 | 9/1991 |
| JP | 11-054326 A | 2/1999 |

(Continued)

OTHER PUBLICATIONS

Machine translation of JP 2010-177380, translated Jun. 6, 2014.*

(Continued)

*Primary Examiner* — Stephen E Jones
*Assistant Examiner* — Scott S Outten
(74) *Attorney, Agent, or Firm* — McDermott Will & Emery LLP

(57) ABSTRACT

The present invention relates to a common mode filter and a method of manufacturing the same. In order to implement a common mode filter with low shrinkage, high substrate sintered density, and high strength, the present invention provides a common mode filter including: a lower substrate; an insulating layer having a conductor pattern inside and provided on the lower substrate; an upper substrate provided on the insulating layer; and a ferrite core made of ferrite and provided in the center of the insulating layer, the lower substrate, and the upper substrate by penetrating the insulating layer, the lower substrate, and the upper substrate, and a method of manufacturing the same.

6 Claims, 3 Drawing Sheets

(51) Int. Cl.
*H01F 17/00* (2006.01)
*H03H 7/42* (2006.01)
*H03H 1/00* (2006.01)

(56) References Cited

U.S. PATENT DOCUMENTS

| | | | |
|---|---|---|---|
| 2004/0252825 A1* | 12/2004 | Sedio et al. | 379/391 |
| 2007/0139151 A1* | 6/2007 | Nussbaum | 336/200 |
| 2009/0278627 A1* | 11/2009 | Umemoto et al. | 333/185 |

FOREIGN PATENT DOCUMENTS

| | | | |
|---|---|---|---|
| JP | 2002-203718 | | 7/2002 |
| JP | 2002-203718 | A | 7/2002 |
| JP | 2003-133135 | A | 5/2003 |
| JP | 2004-040001 | A | 2/2004 |
| JP | 2004-260008 | A | 9/2004 |
| JP | 2005-150137 | A | 6/2005 |
| JP | 2005-243807 | A | 9/2005 |
| JP | 2005-306696 | A | 11/2005 |
| JP | 2008-160043 | A | 7/2008 |
| JP | 2008-218950 | A | 9/2008 |
| JP | 2010-177380 | | 8/2010 |
| JP | 2010-205905 | A | 9/2010 |
| JP | 2011-198973 | A | 10/2011 |
| KR | 10-2006-0126887 | | 12/2006 |

OTHER PUBLICATIONS

Machine Translation of 2005-150137, translated Oct. 28, 2014. Examiner provided.*

Japanese Office Action issued in Japanese Application No. 2012-097644 dated Jun. 3, 2014.

Korean Office Action issued in Corresponding Korean Application No. 10-2011-0146880, dated Aug. 13, 2014.

* cited by examiner

- PRIOR ART -

COMMON MODE FILTER AND METHOD OF MANUFACTURING THE SAME

CROSS-REFERENCE TO RELATED APPLICATIONS

Claim and incorporate by reference domestic priority application and foreign priority application as follows:

Cross Reference to Related Application

This application claims the benefit under 35 U.S.C. Section 119 of Korean Patent Application Serial No. 10-2011-0146880, entitled filed Dec. 30, 2011, which is hereby incorporated by reference in its entirety into this application.

BACKGROUND OF THE INVENTION

1. Field of the Invention

The present invention relates to a common mode filter and a method of manufacturing the same, and more particularly, to a common mode filter including a ferrite core provided in the center of an insulating layer and a lower substrate and/or an upper substrate by penetrating the insulating layer and the lower substrate and/or the upper substrate, and a method of manufacturing the same.

2. Description of the Related Art

In recent times, there is a need for high transmission speed due to system configuration and increases in data capacity. As a high speed transmission method, a differential signaling method is mainly used.

In general, when converting a signal into a radio frequency in order to increase transmission speed, undesired electromagnetic waves (that is, noise) are generated according to conversion of the signal into a radio frequency so that the signal and the noise are overlapped with each other.

Accordingly, common mode noise is generated due to unbalance between high speed differential signal lines (that is, two signal lines).

A common mode filter is mainly used to remove this common mode noise. The common mode filter is an EMI filter which is mainly applied to the high differential signal line.

The common mode noise is noise generated in the differential signal line, and the common mode filter removes such noise, which can not be removed by an existing EMI filter. The common mode filter contributes to improvement of antenna characteristics of mobile phones or EMI characteristics of home appliances.

However, when more data are communicated between a main device and a peripheral device over a GHz radio frequency band, as described above, it is difficult to provide smooth data processing due to signal delay and other obstacles.

Especially, in various port to port connection of communication, video, and audio signal lines such as digital TVs, the above-described internal signal line delay and transmission/reception distortion more frequently occur.

In order to solve the above problem, existing EMI prevention parts (for example, common mode filter) are manufactured in coil type or stack type, but the coil type or stack type EMI prevention parts are applied only to specific portions or large-area circuit boards since they have a large chip part size and poor electrical characteristics.

Moreover, in these days, since electronic products have been developed to have slim, miniaturized, complex, and multifunctional characteristics, EMI prevention parts that meet these characteristics are on the rise. Although the coil type or stack type EMI prevention parts, which correspond to the slim and miniaturized electronic products, have been manufactured, since there is a limitation in forming a complex internal circuit in a small area, recently, there is a need for manufacture of a thin film type common mode filter.

FIG. 1 is an exploded perspective view of a conventional common mode filter disclosed in Japanese Patent Application Laid-Open No. 2002-203718. The conventional common mode filter includes magnetic substrates 110A and 110B and non-magnetic insulating layers 120A to 120D.

Spiral coil patterns 130, 140, 150, and 160 are formed on the insulating layers 120A to 120D. The insulating layers 120A to 120D are laminated to form a non-magnetic insulator block 120. The coil patterns 130, 140, 150, and 160 are embedded in the insulator block 120, and the insulator block 120 is inserted between the magnetic substrates 110A and 110b to form the common mode filter. The coil patterns 130, 140, 150, and 160 form two coils, and terminals of each coil are electrically connected to external electrodes.

In this conventional thin film type common mode filter, adhesive strength of the external electrode to the insulator block 120 is low due to a decrease in area of the external electrode. Therefore, when being mounted to mobile electronic devices, reliability may be deteriorated.

Meanwhile, when looking into a conventional method of manufacturing a common mode filter, a green sheet is manufactured by mixing ferrite powder, a solvent, a binder, and other dispersants to prepare the mixture into a slurry or paste form and performing a die casting or printing process. Next, the manufactured green sheets are laminated with a desired thickness and sintered. In some cases, sintering is performed in a state in which a predetermined weight is applied.

At this time, when looking into the sintered substrate, there is a difference in thickness between an outer portion and a center portion of the substrate and warpage of the substrate occurs, and accordingly, the substrate is not suitable for being used as ferrite substrates for EMI and EMC such as common mode filter products since it is broken or cracked by a slight impact.

And, there is also a local difference in sintered density of the sintered substrate and a gap is generated in the non-sintered portion so that an internal gap or corrosion is caused by permeation of a chemical solution used in a photolithography process.

The thin film type common mode filter forms an internal conductor pattern on the sintered ferrite substrate by a photolithography process and forms a ferrite resin layer, which is made of a mixture of ferrite and a resin, on the substrate. At this time, the ferrite resin layer has low magnetic permeability and Q values compared to the sintered ferrite substrate and thus problems such as reduction of impedance are caused in real chip characteristics.

And, in the process of laminating the ferrite resin layer, since an outer form of the ferrite substrate is deformed or strength of the ferrite substrate is reduced, bad dimensions and adhesion with external electrodes are becoming problems.

RELATED ART DOCUMENT

Patent Document

Patent Document 1: Japan Patent Laid-open Publication No. 2002-203718

SUMMARY OF THE INVENTION

The present invention has been invented in order to overcome the above-described problems and it is, therefore, an object of the present invention to provide a common mode filter including a ferrite core provided in the center of an insulating layer and a lower substrate and/or an upper substrate by penetrating the insulating layer and the lower substrate and/or the upper substrate, and a method of manufacturing the same.

In accordance with one aspect of the present invention to achieve the object, there is provided a common mode filter including: a lower substrate; an insulating layer having a conductor pattern inside and provided on the lower substrate; an upper substrate provided on the insulating layer; and a ferrite core made of ferrite and provided in the center of the insulating layer and the lower substrate or the upper substrate by penetrating the insulating layer and the lower substrate or the upper substrate.

And, in accordance with another aspect of the present invention to achieve the object, there is provided a common mode filter including: a lower substrate; an insulating layer having a conductor pattern inside and provided on the lower substrate; an upper substrate provided on the insulating layer; and a ferrite core made of ferrite and provided in the center of the insulating layer, the lower substrate, and the upper substrate by penetrating the insulating layer, the lower substrate, and the upper substrate.

Here, the lower substrate and the upper substrate are made of ferrite.

At this time, the insulating layer is made of at least one material or a mixture of at least two materials selected from epoxy, polyimide, and polyamide.

Otherwise, the insulating layer is formed by mixing at least one material of $B_2O3$-$SiO_2$ glass and $Al_2O_3$—$SiO_2$ glass and at least one low temperature fired ceramic powder of $SiO_2$, $B_2O_3$, $Al_2O_3$, $Li_2O$, MgO, CaO, SrO, and ZnO.

Meanwhile, the common mode filter further includes a bonding layer between the lower substrate and the insulating layer and/or between the upper substrate and the insulating layer.

And, the conductor pattern formed inside the insulating layer is formed of a plurality of layers.

At this time, upper and lower layers of the conductor patterns formed of the plurality of layers are connected through a via hole.

In accordance with still another aspect of the present invention to achieve the object, there is provided a method of manufacturing a common mode filter including the steps of: preparing a lower substrate, an upper substrate, and an insulating layer having a conductor pattern inside; sequentially laminating the lower substrate, the upper surface, and the insulating layer from the bottom; forming a hole penetrating the insulating layer and the lower substrate or the upper substrate; and forming a ferrite core made of ferrite in the hole.

At this time, the step of forming the hole is performed by a routing process.

And, the step of forming the ferrite core includes the steps of filling slurry made of ferrite in the hole; and curing the slurry.

Further, the slurry is formed by mixing ferrite powder and a resin consisting of at least one material or a mixture of at least two materials selected from epoxy, polyimide, and polyamide.

Further, the slurry is formed by further mixing additive powder made of at least one material or a mixture of at least two materials selected from a copper oxide, a nickel oxide, and a zinc oxide.

Further, the ferrite powder or the additive powder is balled and the powder particles are mixed by being uniformly dispersed through a 3-roll-miller.

Further, a weight ratio of the ferrite powder and the resin is 8:2 to 9:1.

Further, the step of filling the slurry is performed by a screen printing method or a die coating method.

Further, the slurry has different particle sizes.

Further, the slurry consists of granulated particles with a particle size of 2 to 3 μm and minute particles with a particle size of 0.3 to 0.5 μm.

Further, the step of filling the slurry separately fills the slurry with different particle sizes.

Further, the slurry with a particle size of 2 to 3 μm is primarily filled and the slurry with a particle size of 0.3 to 0.5 μm is secondarily filled.

Further, a vacuum deaeration process for removing air bubbles included in the slurry is performed before the step of curing.

Further, the step of curing raises a temperature at 1° C./min in a low temperature region and raises a temperature at 5° C./min in a high temperature region.

Further, in the step of laminating, a bonding layer is further laminated between the lower substrate and the insulating layer and/or between the upper substrate and the insulating layer to bond the lower substrate, the upper substrate, and the insulating layer.

Further, the bonding layer is formed by mixing ferrite powder and a resin consisting of at least one material or a mixture of at least two materials selected from epoxy, polyimide, and polyamide.

Further, the lower substrate and the upper substrate are made of ferrite.

Further, the insulating layer is made of at least one material or a mixture of at least two materials selected from epoxy, polyimide, and polyamide.

Further, the insulating layer is formed by mixing at least one material of $B_2O3$-$SiO_2$ glass and $Al_2O_3$—$SiO_2$ glass and at least one low temperature fired ceramic powder of $SiO_2$, $B_2O_3$, $Al_2O_3$, $Li_2O$, MgO, CaO, SrO, and ZnO.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
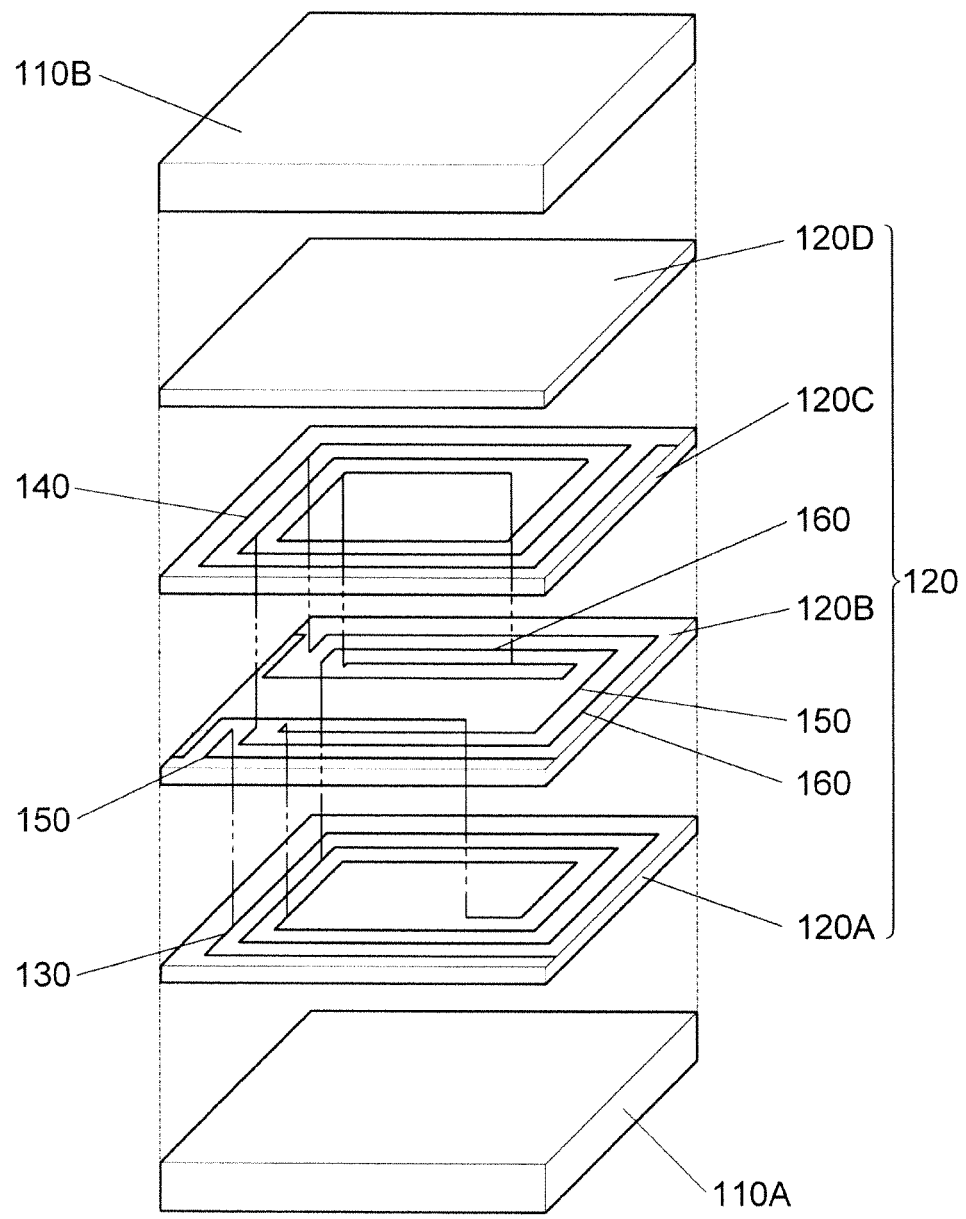
FIG. 1 is an exploded perspective view of a conventional common mode filter.

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Hereinafter, a configuration and an operational effect of the present invention will be described in detail with reference to the accompanying drawings.

Figure 2:
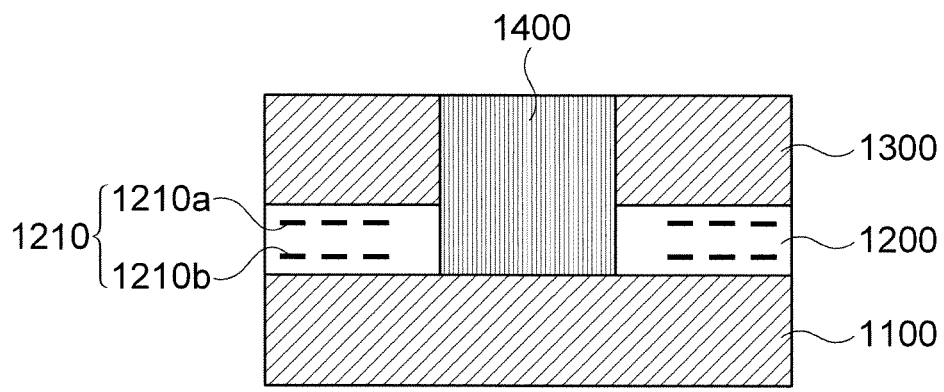
FIG. 2 is a cross-sectional view for explaining a structure of a common mode filter in accordance with the present invention.

FIG. 2 is a cross-sectional view for explain a structure of a common mode filter 1000 in accordance with the present invention.

Referring to FIG. 2, the common mode filter 1000 in accordance with the present invention may include a lower substrate 1100, an insulating layer 1200 provided on the lower substrate 1100, an upper substrate 1300 provided on the insulating layer 1200, and a ferrite core 1400 provided in the center of the insulating layer 1200 and the lower substrate 1100 or the upper substrate 1300 by penetrating the insulating layer 1200 and the lower substrate 1100 or the upper substrate 1300.

Figure 3:
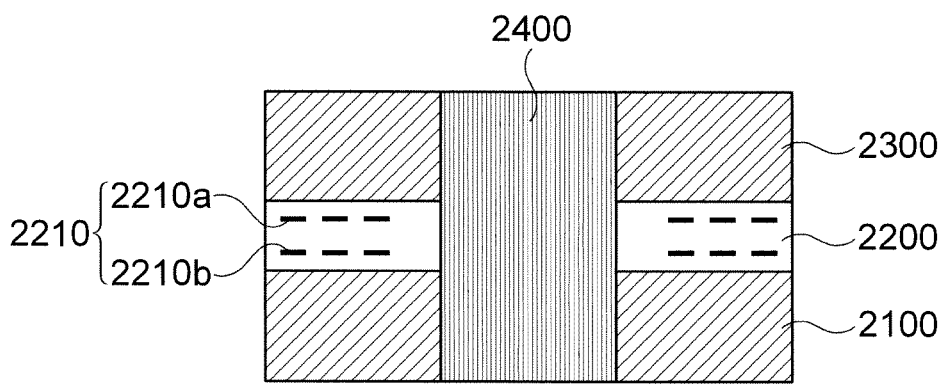
FIG. 3 is a cross-sectional view for explaining a structure of a common mode filter in accordance with another embodiment of the present invention.

FIG. 3 is a cross-sectional view for explain a structure of a common mode filter 2000 in accordance with another embodiment of the present invention. Referring to FIG. 3, the common mode filter 2000 in accordance with another embodiment of the present invention may include a lower substrate 2100, an insulating layer 2200 provided on the lower substrate 2100, an upper substrate 2300 provided on the insulating layer 2200, and a ferrite core 2400 provided in the center of the insulating layer 2200, the lower substrate 2100, and the upper substrate 2300 by penetrating the insulating layer 2200, the lower substrate 2100, and the upper substrate 2300.

Here, the lower substrate 1100 and 2100 and the upper substrate 1300 and 2300 may be made of ferrite.

And, the ferrite core 1400 and 2400 may be formed by curing slurry which is formed by mixing ferrite powder and a resin consisting of at least one material or a mixture of at least two materials selected from epoxy, polyimide, and polyamide.

The conductor pattern 1210 and 2210 is formed inside the insulating layer 1200 and 2200 in the form of a primary coil and a secondary coil. At this time, the conductor pattern 1210 and 2210 may be formed of a plurality of layers 1210a, 1210b, 2210a, and 2210b, and in this case, the upper and lower layers may be connected through a via hole.

When flowing electricity to the conductor pattern 1210 and 2210 with this structure, a magnetic field is formed around the conductor pattern 1210 and 2210. The magnetic field is formed by overlapping magnetic fields generated from the plurality of layers of the conductor pattern 1210 and 2210. A magnetic flux of the magnetic field formed like this flows along the upper substrate 1300 and 2300, the lower substrate 1100 and 2100, and the ferrite core 1400 and 2400.

The insulating layer 1200 and 2200 may be made of at least one material or a mixture of at least two materials selected from epoxy, polyimide, and polyamide.

Or, the insulating layer 1200 and 2200 may be formed by mixing at least one material of $B_2O_3$-$SiO_2$ glass and $Al_2O_3$—$SiO_2$ glass and at least one low temperature fired ceramic powder of $SiO_2$, $B_2O_3$, $Al_2O_3$, $Li_2O$, MgO, CaO, SrO, and ZnO.

Meanwhile, the common mode filter 1000 in accordance with the present invention and the common mode filter 2000 in accordance with another embodiment of the present invention may additionally include a bonding layer (not shown) between the lower substrate 1100 and 2100 and the insulating layer 1200 and 2200 and/or between the upper substrate 1300 and 2300 and the insulating layer 1200 and 2200 to bond between the lower substrate 1100 and 2100, the upper substrate 1300 and 2300, and the insulating layer 1200 and 2200.

Like this, the common mode filter 1000 in accordance with the present invention and the common mode filter 2000 in accordance with another embodiment of the present invention can implement a common mode filter with high strength as well as remarkably reducing shrinkage occurring when bonding a substrate and a ferrite resin layer in a process of manufacturing a common mode filter by disposing the upper substrate 1300 and 2300 and the lower substrate 1100 and 2100, which are made of ferrite, in upper and lower portions of the common mode filter, thus providing an effect of improving important characteristics of filter chip parts for removing noise, that is, magnetic permeability and Q values.

Further, it provides an effect of improving adhesion with an external electrode by preventing non-uniformity of flatness due to a structure of a conventional common mode filter.

Now, a method of manufacturing a common mode filter 1000 in accordance with the present invention will be specifically described.

FIGS. 4A-4D illustrate a process of manufacturing a common mode filter 1000 in accordance with the present invention.

Figure 4A:
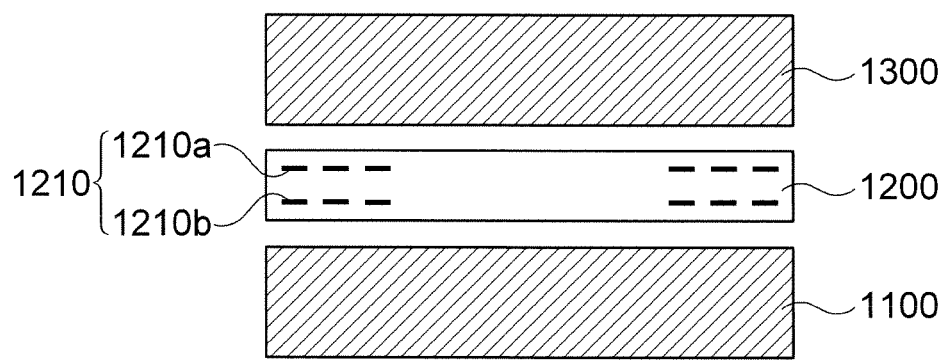
FIGS. 4A-4D illustrate a process of manufacturing a common mode filter in accordance with the present invention.

Referring to FIGS. 4A-4D, in a method of manufacturing a common mode filter 1000 in accordance with the present invention, first, a step of preparing a lower substrate 1100, an upper substrate 130, and an insulating layer 120 having a conductor pattern 1210 inside is performed (FIG. 4a).

As described above, the lower substrate 1100 and the upper substrate 1300 are made of ferrite.

And, the insulating layer 1200 is made of at least one material or a mixture of at least two materials selected from epoxy, polyimide, and polyamide or formed by mixing at least one material of $B_2O_3$-$SiO_2$ glass and $Al_2O_3$—$SiO_2$ glass and at least one low temperature fired ceramic powder of $SiO_2$, $B_2O_3$, $Al_2O_3$, $Li_2O$, MgO, CaO, SrO, and ZnO.

The conductor pattern 1210 may be formed in the form of a primary coil and a secondary coil. At this time, the conductor pattern 1210 may be formed of a plurality of layers 1210a and 1210b, and in this case, the upper and lower layers may be connected through a via hole 1410.

The conductor pattern 1210 formed inside a bonding layer (not shown) may be formed by a photolithography process. That is, assuming that the conductor pattern 1210 is formed of a plurality of layers, the plurality of layers 1210a and 1210b may be sequentially laminated in such a way of laminating the insulating layer 1200 on the lower substrate 1100 and printing the first conductor pattern 1210a by a photolithography process.

Figure 4B:
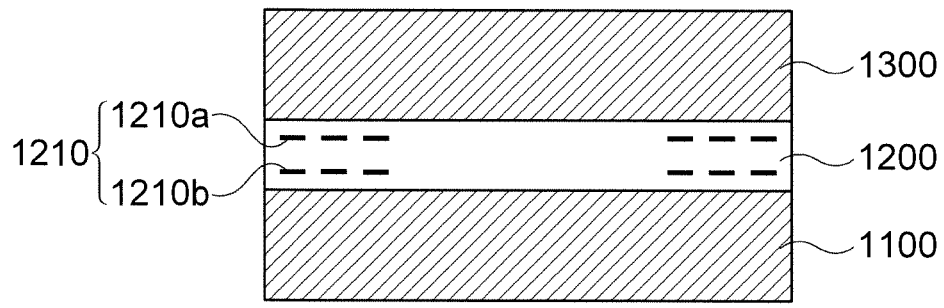

Next, a step of sequentially laminating the lower substrate 1100, the upper substrate 1300, and the insulating layer 1200 from the bottom is performed (FIG. 4b).

When firing the laminated lower substrate 1100, insulating layer 1200, and upper substrate 130 collectively at a low temperature of 400 to 600° C., glass or low temperature fired ceramic powder constituting the insulating layer 1200 reacts with a ferrite composition included in the upper substrate 1300 and the lower substrate 1100 in a process of grain growth to secure bonding strength between interfaces, and when the conductor pattern 1210 is formed of a plurality of layers, it is advantageous to manufacture of small and slim chips by good alignment between layers.

In addition, in the lamination step of the method of manufacturing a common mode filter 1000 in accordance with the present invention, the bonding layer (not shown) may be additionally laminated between the lower substrate 1100 and the insulating layer 1200 and/or between the upper substrate 1300 and the insulating layer 1200 to bond between the lower substrate 1100, the upper substrate 1300, and the insulating layer 1200.

The bonding layer (not shown) may be formed by mixing ferrite powder and a resin consisting of at least one material and a mixture of at least two materials selected from epoxy, polyimide, and polyamide.

Since the bonding layer (not shown) formed as above has a relatively high resin content ratio compared to the upper substrate, the lower substrate, and the ferrite resin layer, it is possible to improve bonding strength between the lower substrate 1100 and the insulating layer 120 and/or between the upper substrate 1300 and the insulating layer 1200.

When describing the lamination step in more detail, after sequentially laminating the lower substrate 1100, the upper laminate 1300, and the insulating layer 1200 from the bottom and additionally laminating the bonding layer (not shown) between the lower substrate 1100 and the insulating layer 1200 and/or between the upper substrate 1300 and the insulating layer 1200, the lamination process is performed in a state in which pressure is applied at a temperature of 180 degrees using ultrasonic waves or microwaves.

Figure 4C:
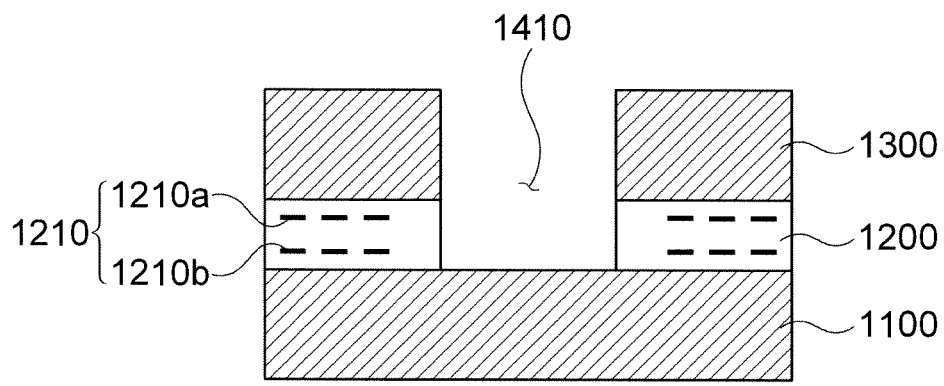

Next, a step of forming a hole 1410 penetrating the insulating layer 1200 and the lower substrate 1100 and/or the upper substrate 1300 is performed (FIG. 4c).

The step of forming the hole 1410 may be performed by a routing process.

A diameter of the hole 1410 may be formed with a size in the appropriate range in correspondence to required specification values of the common mode filter. That is, when the diameter of the hole 1410 is increased, since it is possible to increase magnetic permeability by increasing the amount of a ferrite core 1400, but on the other hand, a thickness of the conductor pattern 1210 or an interval between the conductor patterns 1210, which affect Q values, may be limited, it is preferable to form the hole 1410 with a size in the appropriate range considering these parameters.

Figure 4D:
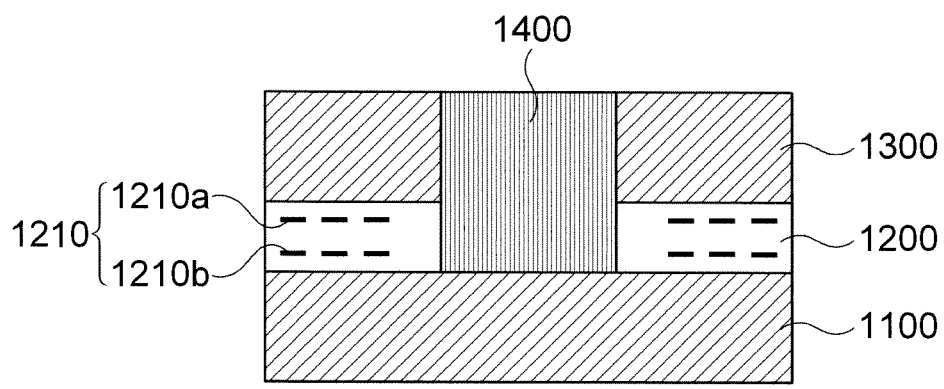

Next, a step of forming the ferrite core 1400, which is made of ferrite, in the hole 1410 is performed (FIG. 4d).

This step can be performed through a step of filling slurry, which is made of ferrite, in the hole 1410 and a step of curing the slurry.

Here, the slurry may be formed by mixing ferrite powder and a resin consisting of at least one material or a mixture of at least two materials selected from epoxy, polyimide, and polyamide.

In order to set a sufficient magnetic flux path of a magnetic field formed around the conductor pattern 1210 and secure bonding strength between the upper substrate 1300, the lower substrate 1100, and the insulating layer 1200, it is preferred that a weight ratio of the ferrite powder and the resin constituting the slurry is set in the range of 8:2 to 9:1.

In addition, for improvement of the overall distribution of magnetic permeability, improvement of Q values, and prevention of external moistures and other deterioration, the slurry may be formed by further mixing additive powder which is made of at least one material or a mixture of at least two materials selected from a copper oxide, a nickel oxide, and a zinc oxide.

After the ferrite powder or the additive powder is balled, the powder particles are uniformly dispersed and mixed through a 3-roll-miller.

When filling the slurry prepared as above in the hole 1410, the slurry may be filled by a screen printing method or a die coating method, and at this time, the slurry with different particle sizes may be filled.

More specifically, the slurry may consist of granulated particles with a particle size of 2 to 3 μm and minute particles with a particle size of 0.3 to 0.5 μm.

Like this, when filling the slurry, which consists of granulated particles with a particle size of 2 to 3 μm and minute particles with a particle size of 0.3 to 0.5 μm, in the hole 1410, since the minute particles can be filled in an empty space formed between the granulated particles, it is possible to increase a packing factor of the slurry, and accordingly, it is possible to improve electrical characteristics such as magnetic permeability, inductance value, and so on.

Or, when filling the slurry, the slurry with different particle sizes may be separately filled. More specifically, the slurry with a particle size of 2 to 3 μm may be primarily filled, and the slurry with a particle size of 0.3 to 0.5 μm may be secondarily filled.

Like this, when separately filling the slurry with different particle sizes, as described above, the minute particles may be filled in the empty space formed between the granulated particles to improve a packing factor of the slurry, and accordingly, it is possible to improve electrical characteristics such as magnetic permeability, inductance value, and so on.

Meanwhile, the method of manufacturing a common mode filter 1000 in accordance with the present invention may additionally perform a vacuum deaeration process for removing air bubbles included in the slurry before the curing step.

When directly curing the slurry filled in the hole 1410, a plurality of air bubbles may be formed in a resin solvent due to separation of the powder and the resin and thus a plurality of pores may be formed in the ferrite core 1400 after the final curing. Since this finally causes reductions in magnetic permeability and Q values and degradation of reliability of the final product such as impedance, insulation resistance, and high temperature/moisture resistant load, it is advantageous to additionally perform the vacuum deaeration process for removing air bubbles before curing the slurry.

The step of curing the slurry is performed after removing the air bubbles included in the slurry. At this time, the slurry is cured by slowing raising a temperature at 1° C./min in a low temperature region and rapidly raising a temperature at 5° C./min in a high temperature region.

This is because a plurality of air bubbles are generated due to cracks and rapid shrinkage when rapidly raising a temperature from the beginning.

Here, the low temperature region means a region in the range of 30 to 130° C., and the high temperature region means a region in the range of 131 to 180° C.

According to the method of manufacturing a common mode filter 1000 in accordance with the present invention, it is possible to improve important characteristics of filter chip parts for removing noise, that is, magnetic permeability and Q values by forming the ferrite core 1400 with a high ferrite packing factor.

Table 1 is a comparison table of impedance values of a common mode filter manufactured by a conventional method and a common mode filter manufactured in accordance with a manufacturing method of the present invention, Table 2 is a comparison table of magnetic permeability, and Table 3 is a comparison result of adhesive strength between the substrate and the insulating layer 1200.

Here, a sample number represents a number of a sample taken in the same condition, the impedance value is measured in a frequency band of 100 MHz by using an impedance analyzer (HP 4294A), and the adhesive strength is measured by measuring cutting strength by applying predetermined power to a chip to push the chip using a universal testing machine (UTM) after mounting the chip on the upper substrate.

Referring to Table 1, in a frequency of 100 MHz, while the common mode filter manufactured by the conventional method has an impedance value of average 71Ω, the common mode filter manufactured in accordance with the manufacturing method of the present invention has an impedance value of 90Ω, which is improved by 11%.

As shown in Table 2, while the common mode filter manufactured by the conventional method has magnetic permeability of average 10, the common mode filter manufactured in accordance with the manufacturing method of the present invention has magnetic permeability of 22, which is improved about twice.

Further, while the common mode filter manufactured by the conventional method has adhesive strength of average 0.5 Kgf, the common mode filter manufactured in accordance with the manufacturing method of the present invention has adhesive strength of 0.9 Kgf which is improved by 60%.

TABLE 1

| Sample number | Existing structure | The present invention structure (unit: Ω) |
| --- | --- | --- |
| 1 | 81 | 89 |
| 2 | 79 | 90 |
| 3 | 82 | 91 |
| 4 | 80 | 90 |
| 5 | 81 | 89 |
| Average | 81 | 90 |

TABLE 2

| Sample number | Existing structure | The present invention structure |
| --- | --- | --- |
| 1 | 8 | 22 |
| 2 | 9 | 23 |
| 3 | 12 | 23 |
| 4 | 12 | 22 |
| 5 | 10 | 21 |
| Average | 10 | 22 |

TABLE 3

| Sample number | Existing structure | The present invention structure (unit: Kgf) |
| --- | --- | --- |
| 1 | 0.5 | 0.9 |
| 2 | 0.6 | 0.9 |
| 3 | 0.4 | 1 |
| 4 | 0.4 | 0.8 |
| 5 | 0.5 | 0.9 |
| Average | 0.5 | 0.9 |

According to the common mode filter and the method of manufacturing the same in accordance with the present invention, it is possible to implement a common mode filter with high strength as well as remarkably reducing shrinkage occurring when bonding a substrate and a ferrite resin layer in a process of manufacturing a common mode filter by disposing an upper substrate and a lower substrate made of ferrite in upper and lower portions of the common mode filter, thus providing an effect of improving important characteristics of filter chip parts for removing noise, that is, magnetic permeability and Q values.

Further, according to the common mode filter and the method of manufacturing the same in accordance with the present invention, it is possible to improve adhesion with an external electrode by preventing non-uniformity of flatness due to a structure of a conventional common mode filter.

According to the method of manufacturing a common mode filter, it is possible to improve important characteristics of filter chip parts for removing noise, that is, magnetic permeability and Q values by forming a ferrite core with a high ferrite packing factor.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A common mode filter comprising:
a lower substrate;
an insulating layer having a plurality of internal conductor patterns and provided on the lower substrate;
an upper substrate provided on the insulating layer; and
a ferrite core made of ferrite and provided in the center of the insulating layer and only one of the lower substrate and the upper substrate by penetrating the insulating layer and the lower substrate or the upper substrate,
wherein the other one of the lower substrate and the upper substrate does not include a ferrite core made of ferrite provided in the center thereof.

2. The common mode filter according to claim 1, wherein upper and lower layers of the conductor pattern formed of the plurality of layers are connected through a via hole.

3. The common mode filter according to claim 1, wherein the lower substrate and the upper substrate are made of ferrite.

4. The common mode filter according to claim 1, wherein the insulating layer is made of at least one material or a mixture of at least two materials selected from epoxy, polyimide, and polyamide.

5. The common mode filter according to claim 1, wherein the insulating layer is formed by mixing at least one material of $B_2O_3$—$SiO_2$ glass and $Al_2O_3$—$SiO_2$ glass and at least one low temperature fired ceramic powder of $SiO_2$, $B_2O_3$, $Al_2O_3$, $Li_2O$, $MgO$, $CaO$, $SrO$, and $ZnO$.

6. The common mode filter according to claim 1, further comprising:

a bonding layer between the lower substrate and the insulating layer and/or between the upper substrate and the insulating layer.

\* \* \* \* \*